United States Patent
Adachi et al.

(10) Patent No.: US 10,971,339 B2
(45) Date of Patent: Apr. 6, 2021

(54) ION SOURCE AND CLEANING METHOD THEREOF

(71) Applicant: NISSIN ION EQUIPMENT CO., LTD., Koka (JP)

(72) Inventors: Masakazu Adachi, Shiga (JP); Yuya Hirai, Shiga (JP); Tomoya Taniguchi, Shiga (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 0 days.

(21) Appl. No.: 16/787,748

(22) Filed: Feb. 11, 2020

(65) Prior Publication Data

US 2020/0279720 A1    Sep. 3, 2020

(30) Foreign Application Priority Data

Mar. 1, 2019 (JP) .............................. JP2019-037302

(51) Int. Cl.
*H01J 37/08* (2006.01)
*H01J 37/30* (2006.01)
*H01J 37/32* (2006.01)

(52) U.S. Cl.
CPC ........ *H01J 37/32412* (2013.01); *H01J 37/08* (2013.01); *H01J 37/3002* (2013.01); *H01J 37/3288* (2013.01); *H01J 37/32568* (2013.01); *H01J 37/32798* (2013.01); *H01J 37/32862* (2013.01)

(58) Field of Classification Search
CPC ............. H01J 37/32412; H01J 37/3002; H01J 37/32798; H01J 37/08; H01J 37/32568; H01J 37/32357; H01J 37/09; H01J 37/15; H01J 37/304; H01J 37/32422; H01J 37/3171; H01J 37/32862; H01J 27/024; C23C 14/48
USPC ............................................. 250/423 R, 424
See application file for complete search history.

(56) References Cited

U.S. PATENT DOCUMENTS

| | | |
|---|---|---|
| 2005/0016838 A1 | 1/2005 | Murata et al. |
| 2007/0137671 A1 | 6/2007 | DiVergilio et al. |
| 2014/0099430 A1 | 4/2014 | Levay et al. |
| 2014/0127394 A1 | 5/2014 | Gammel et al. |
| 2014/0326901 A1 | 11/2014 | Colvin et al. |
| 2015/0101634 A1* | 4/2015 | Leavitt .................. H01J 27/022 134/1.1 |

FOREIGN PATENT DOCUMENTS

JP      2004-363050 A    12/2004

OTHER PUBLICATIONS

Partial European Search Report dated Jul. 6, 2020, from the European Patent Office in Application No. 20157440.7.

* cited by examiner

*Primary Examiner* — Nicole M Ippolito
(74) *Attorney, Agent, or Firm* — Sughrue Mion, PLLC

(57) ABSTRACT

An ion source includes a plasma chamber, and a suppression electrode disposed downstream of the plasma chamber, and is operable to irradiate the suppression electrode with an ion beam produced from a cleaning gas to clean the suppression electrode. Prior to cleaning, the ion source moves the suppression electrode or the plasma chamber in a first direction to increase a distance between the plasma chamber and the suppression electrode.

16 Claims, 4 Drawing Sheets

ION SOURCE AND CLEANING METHOD THEREOF

CROSS-REFERENCE TO RELATED APPLICATION

This application claims priority from Japanese Patent Application No. 2019-37302, filed in the Japanese Patent Office on Mar. 1, 2019, the entire contents of which is incorporated by reference herein in its entirety.

BACKGROUND

1. Field

The present disclosure relates to an ion source and a cleaning method therefor.

2. Description of Related Art

An ion implantation apparatus generates plasma in a plasma chamber using a halogen-containing gas or vapor as a raw material, and an ion beam is extracted from the plasma chamber using electrodes.

Specific examples of the raw material for plasma generation include $BF_3$, $PF_3$, $AlI_3$ and $AlCl_3$. A halogen component contained in the raw material, such as fluorine, iodine or chlorine is ionized along with plasma generation, and the resulting ions react with an inner wall of the plasma chamber and the electrodes.

Because plasma is generated inside the plasma chamber, an internal temperature of the plasma chamber is relatively high. Therefore, when a product of the above reaction is produced on the wall of the plasma chamber, the reaction product will be thermally dissociated from the wall, and scattered into the plasma chamber and toward the downstream side of the plasma chamber.

On the other hand, the electrodes are typically cooled for the purpose of preventing thermal strain thereof. Thus, the temperature of the electrodes generally becomes relatively less than that of the plasma chamber. For this reason, the reaction product is likely to deposit on a surface of the electrodes.

Further, there is a possibility that metals constituting the wall of the plasma chamber, such as Mo and W, are scattered into the plasma chamber due to sputtering by the plasma, and become bound to the halogen component in the plasma, and the resulting bound substance is deposited on the electrodes. In some cases, such binding can also arise in a region between the plasma chamber and the extraction electrode.

As an operation period of the ion source becomes longer, the amount of a deposition substance on the electrodes increases. This deposition substance is an insulator, so that the deposition substance becomes a factor causing insulation of the electrodes and an abnormal electrical discharge between the plasma chamber and the electrodes may thus occur. If the amount of the deposition substance excessively increases, it becomes impossible to normally operate the ion source.

SUMMARY

According to an aspect of one or more embodiments, there is provided an ion source including a plasma chamber, and a suppression electrode disposed downstream of the plasma chamber, wherein the ion source is operable to irradiate the suppression electrode with an ion beam produced from a cleaning gas to clean the suppression electrode. The ion source further includes a drive mechanism that adjusts a distance between the plasma chamber and the suppression electrode; and a control device configured to, prior to cleaning the suppression electrode, control the drive mechanism to move the suppression electrode or the plasma chamber in a first direction to increase the distance.

According to another aspect of one or more embodiments, there is provided a cleaning method for an ion source comprising a plasma chamber, and a suppression electrode disposed downstream the plasma chamber, the cleaning method comprising moving the suppression electrode or the plasma chamber in a first direction to increase a distance between the plasma chamber and the suppression electrode; and irradiating the suppression electrode with an ion beam produced from a cleaning gas to clean the suppression electrode.

According to another aspect of one or more embodiments, there is provided a ion source including a plasma chamber; a suppression electrode disposed downstream of the plasma chamber in an ion beam extraction direction; a drive mechanism that is connected to the suppression electrode or to the plasma chamber; and a control device configured to control the drive mechanism to move the suppression electrode or the plasma chamber to increase a distance between the plasma chamber and the suppression electrode.

BRIEF DESCRIPTION OF THE DRAWINGS

The above and/or other aspects will become apparent and more readily appreciated from the following description of embodiments, taken in conjunction with the accompanying drawings of which.

DETAILED DESCRIPTION

Figure 1A:
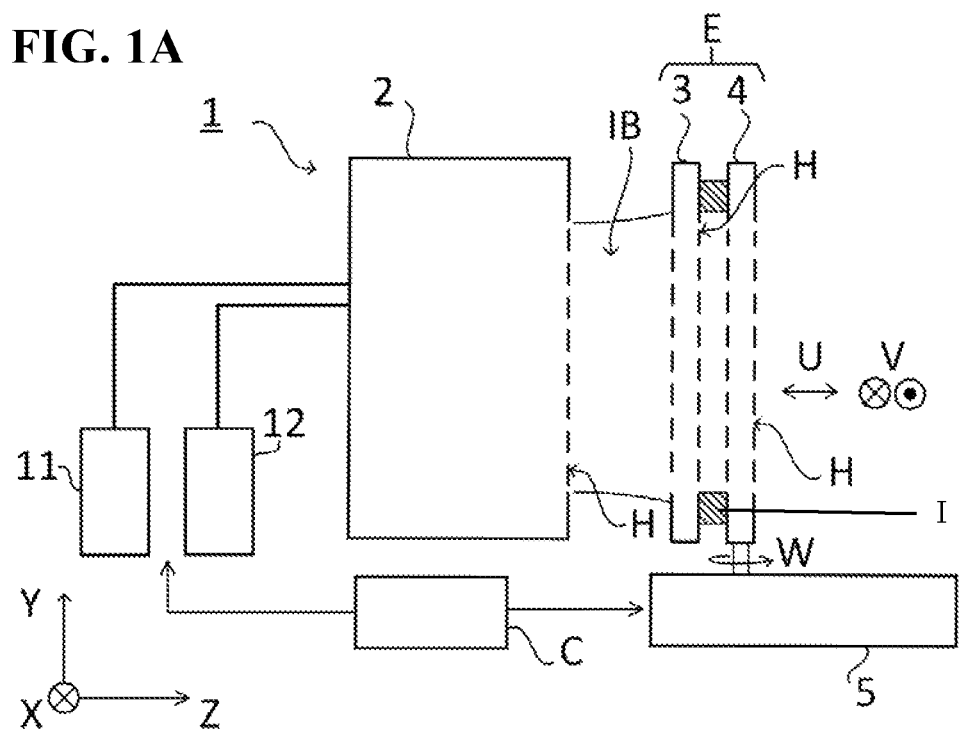
FIGS. 1A and 1B are schematic top plan views of an ion source according to an embodiment.

The embodiments of the present disclosure may be diversely modified. However, it is to be understood that the present disclosure is not limited to a specific embodiment, but includes all modifications, equivalents, and substitutions of embodiments disclosed herein without departing from the scope and spirit of the present disclosure and claims.

In order to address the above described disadvantages caused by the deposition substance, JP 2004-363050A proposes a technique of removing the deposition substance from the electrodes by ion beam sputtering using an ion beam made from rare gas. In JP 2004-363050A, a voltage and supply amount of the rare gas are adjusted such that the intensity of the ion beam sputtering using the ion beam made from the rare gas is maximized.

According to various embodiments, an ion source may include a plasma chamber, and a suppression electrode disposed downstream from the plasma chamber, wherein the ion source is operable to irradiate the suppression electrode with an ion beam produced from a cleaning gas to clean the suppression electrode. The ion source may further include a drive mechanism that adjusts a distance between the plasma chamber and the suppression electrode, and a control device that, prior to the cleaning, controls the drive mechanism to increase the distance between the plasma chamber and the suppression electrode.

Since, prior to the cleaning, the distance between the plasma chamber and the suppression electrode is increased, it is possible to widen a range to be irradiated with an ion beam extracted from the plasma chamber. This makes it possible to more widely remove a deposition substance on the suppression electrode.

The continuation or termination of the cleaning may be determined according to a cleaning duration time. However, from a viewpoint of checking whether or not the suppression electrode is normally cleaned, the control device may advantageously be configured to determine, based on a potential of the suppression electrode, or a current flowing through the suppression electrode, whether or not the cleaning should be continued.

In order to further widen the range to be irradiated with the ion beam, the control device may be advantageously configured to, during the cleaning, or prior to the cleaning, control the drive mechanism to move the suppression electrode in a second direction orthogonal to the first direction.

Alternatively, the control device may be configured to, during the cleaning, or prior to the cleaning, control the drive mechanism to rotate the suppression electrode about a third direction orthogonal to the first direction and the second direction.

According to various embodiments, a cleaning method for the ion source may include irradiating the suppression electrode with an ion beam produced from a cleaning gas to carry out cleaning of the suppression electrode; and, prior to the cleaning, moving the suppression electrode in a first direction, thereby increasing a distance between the plasma chamber and the suppression electrode.

In the various embodiments disclosed herein, prior to the cleaning, the distance between the plasma chamber and the suppression electrode is increased as compared with the distance during normal operation, so that it is possible to widen the range to be irradiated with an ion beam extracted from the plasma chamber. This makes it possible to widely remove a deposition substance on the suppression electrode.

Figure 1B:
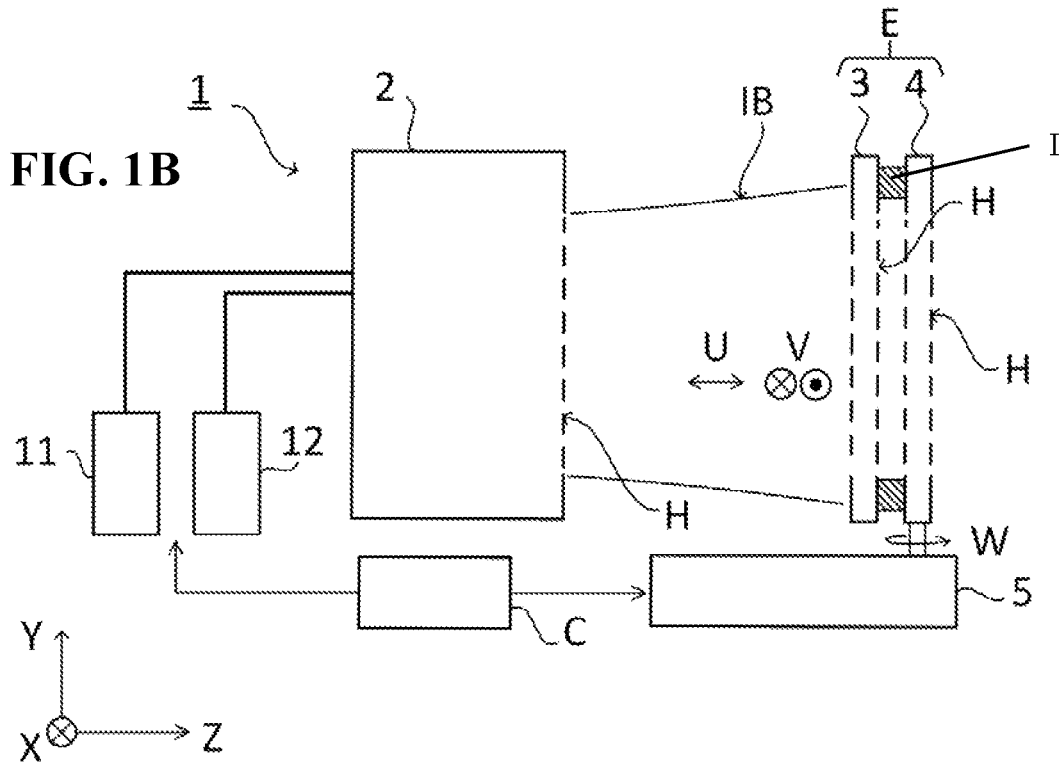

FIGS. 1A and 1B are schematic top plan views of an ion source according to an embodiment. In the figures, a Z-direction is an ion beam extraction direction, and a Y-direction is a longitudinal direction of the after-mentioned plasma chamber 2. Further, an X-direction is orthogonal to both the Y-direction and the Z-direction.

The ion source 1 includes a plasma chamber 2 having one lateral end face formed with one or more ion extraction holes H; two gas bottles (gas cylinders) for supplying, to the plasma chamber 2, various gasses. The two gas bottles may include a dopant gas bottle 11 supplying to the plasma chamber 2 a dopant gas such as $BF_3$, $PH_3$ or $AsF_3$, and a cleaning gas bottle 12 supplying to the plasma chamber 2 a cleaning gas such as argon or xenon. The ion source 1 further includes an extraction electrode E for extracting an ion beam IB from plasma produced inside the plasma chamber 2 by an arc discharge or a high-frequency discharge.

The extraction electrode E includes a suppression electrode 3 for preventing flow of secondary electrons toward the plasma chamber 2, and a ground electrode 4 having a ground potential.

In advance of extraction of the ion beam IB, a potential of the plasma chamber 2 is set to be higher than a potential of the extraction electrode E, using a non-illustrated extraction power supply, whereby an ion beam having a positive electrical charge is extracted from plasma in the plasma chamber 2.

As with the plasma chamber 2, each of the suppression electrode 3 and the ground electrode 4 is formed with one or more ion extraction holes H for allowing the ion beam IB to pass therethrough.

The suppression electrode 3 and the ground electrode 4 are coupled together through one or more insulating members I. The suppression electrode 3 and the ground electrode 4 are configured to be moved in a U-direction (first direction) and a V-direction (second direction) and rotated about the Y-direction (third direction), in a rotational direction indicated by the arrowed line W, as an integral structure, by a drive mechanism 5.

As the drive mechanism 5, a manipulator that adjusts a position and an inclination of the extraction electrode may be used. For example, in some embodiments, the manipulator may be a motor.

The ion source 1 is not particularly limited and may be any type of ion source, for example, any of a bucket-type ion source, a Bemas-type ion source, a Freeman-type ion source, an indirectly heated ion source or a high frequency-type ion source may be employed.

FIG. 1A shows the ion source 1 in a state in which it is operated using the dopant gas 11. In the present specification, this operation of the ion source 1 is referred to as "normal operation". On the other hand, FIG. 1B shows the ion source 1 in a state in which it is operated using the cleaning gas 12. In the present specification, this operation of the ion source 1 is referred to as "cleaning operation".

As can be understood from comparison between FIGS. 1A and 1B, during the cleaning operation (FIG. 1B), the position of the extraction electrode E is shifted in the Z-direction away from the plasma chamber 2, as comparted with the position of the extraction electrode E during the normal operation (FIG. 1A). In other words, a distance between the plasma chamber 2 and the extraction electrode E is increased.

The ion beam IB extracted from the plasma chamber 2 is diffused intentionally or under the influence of the space-charge effect.

When the distance between the plasma chamber 2 and the extraction electrode E is increased, an area of the suppression electrode 3 to be irradiated with the ion beam IB extracted from the plasma chamber 2 is increased.

By increasing the irradiated area, it becomes possible to widely remove a deposition substance on the suppression electrode 3.

The ion source 1 further comprises a control device C. The control device C may include hardware circuitry, control logic, or a microprocessor, and may control the manipulator.

This control device C is configured to allow switching from the normal operation to the cleaning operation to be automatically performed.

For example, with regard to switching from the normal operation to the cleaning operation, the control device C is operable to count a number of times that a glitch occurs in a region between the plasma chamber 2 and the suppression electrode 3, and, when this number becomes greater than a threshold number, to perform switching from the normal operation to the cleaning operation.

Alternatively, the control device C may be configured to, according to an operation duration time during the normal operation of the ion source, switch the operation state, before or after substrate processing using an ion beam. That is, the control device C may determine how long (i.e., a time period) the ion source 1 has been operating in the normal operation, and in response to this time period being equal to or greater than a threshold time period, switch the operation of the ion source 1 to the cleaning operation.

On the other hand, with regard to switching from the cleaning operation to the normal operation, the control device C is operable to monitor the potential of the suppression electrode 3 to determine a timing of the switching by checking whether the monitored potential reaches a setup potential to be applied to the suppression electrode 3.

A given negative voltage is applied to the suppression electrode 3 to cause second electrons to be turned back toward a downstream side. In a situation where a reaction product is deposited on the suppression electrode 3 (i.e., where too much deposition substance is formed on the suppression electrode 3), it is impossible to accurately measure an applied voltage due to the influence of electrical insulation by the deposition substance. In other words, once the deposition substance has been sufficiently cleaned from the suppression electrode 3, an actual measurement value becomes equal to or becomes close to a setup value. Thus, the control device C is configured to monitor the potential of the suppression electrode and to switch the operation state in response to the potential becoming equal to or close to the setup value.

In the above embodiment, it has been described that the control device C is configured to monitor the potential of the suppression electrode 3 as a parameter to be monitored to perform switching from the cleaning operation to the normal operation. Alternatively, the parameter to be monitored may be a current, instead of potential.

Specifically, in a situation where the suppression electrode 3 is covered by a deposition substance, the deposition substance becomes as an obstacle to hinder a surface of the suppression electrode 3 from being irradiated with the ion beam, so that a suppression current flowing through a suppression power supply (not shown) connected to the suppression electrode 3 is lowered as compared with a situation where there is no deposition substance. When the cleaning has progressed to normally remove the deposition substance, the suppression current flowing through the suppression power supply becomes stable and finally becomes a constant value.

Therefore, in the case of monitoring the current, the control device C may be configured to, when a value of the current becomes constant or stable, determine that the deposition substance on the suppression electrode has been sufficiently removed, and switch the operation state from the cleaning operation to the normal operation.

Alternatively, the control device C may be configured to switch the operation state based on a time period taken for the cleaning operation. However, the time period taken for the cleaning operation involves uncertainty about whether or not the cleaning has been fully completed. Thus, it is advantageous to actually measure a value of the voltage or current of the suppression electrode 3 and switch the operation state according to the actual measurement value, as mentioned above.

Figure 2:
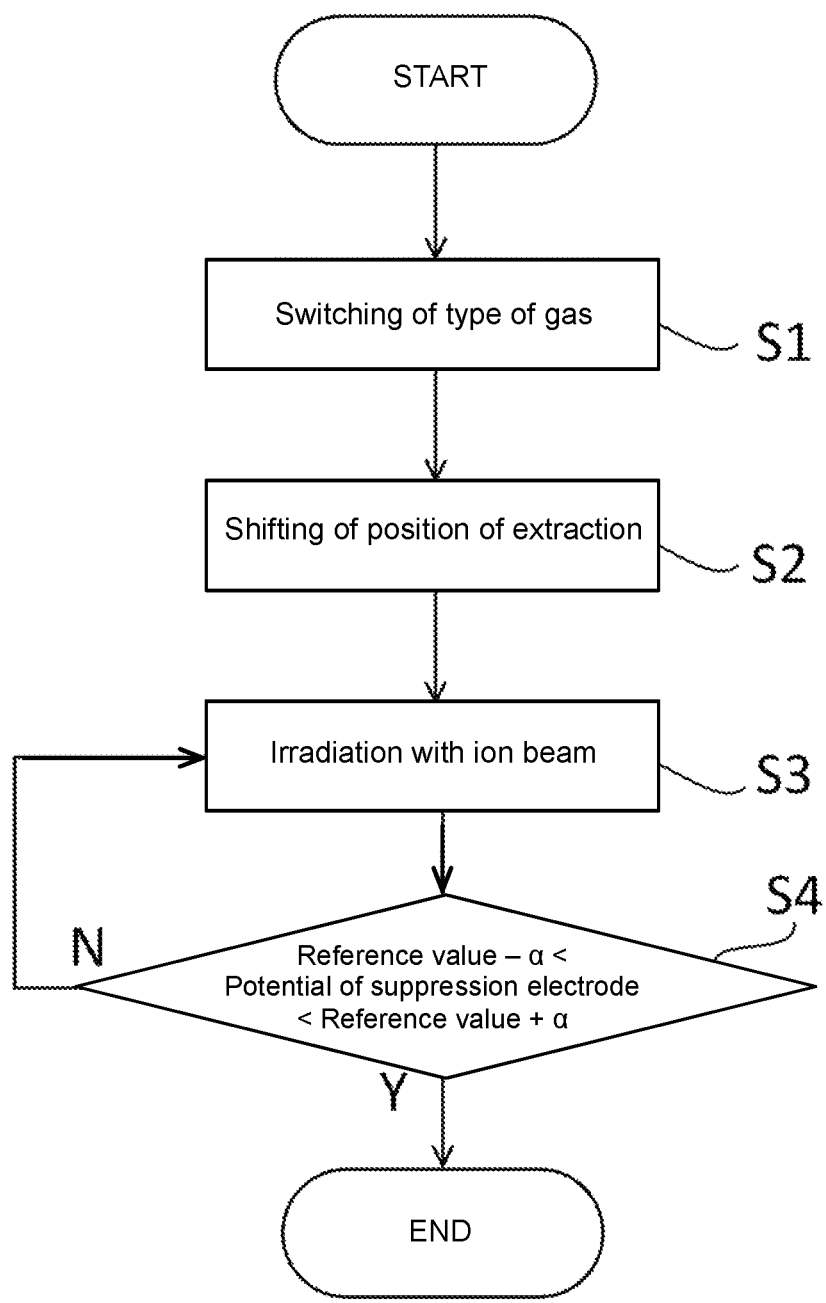
FIG. 2 is a flowchart illustrating a cleaning process for the ion source of FIGS. 1A and 1B, according to an embodiment.

FIG. 2 is a flowchart illustrating a cleaning process to be executed in the ion source 1.

In advance of start of the cleaning operation, the type of gas is switched from the dopant gas to the cleaning gas (S1). When switching the type of gas, a switching operation of valves connected to the gas cylinders 11, 12 for the two types of gases is performed.

Subsequently, the position of the extraction electrode E is shifted (S2). As a result of the shifting of the position of the extraction electrode E, the distance between the plasma chamber 2 and the suppression electrode 3 is increased to reach the state as shown in FIG. 1B.

When the preparation for the cleaning operation has been completed, the suppression electrode is irradiated with the ion beam (S3). Subsequently, a determination as to whether a measured potential of the suppression electrode 3 falls within a given range ($\pm \alpha$) with respect to a reference value (e.g. a setup value) is performed (S4), and when the potential has a value within the given range of the reference value, the cleaning operation is terminated.

Figure 3A:
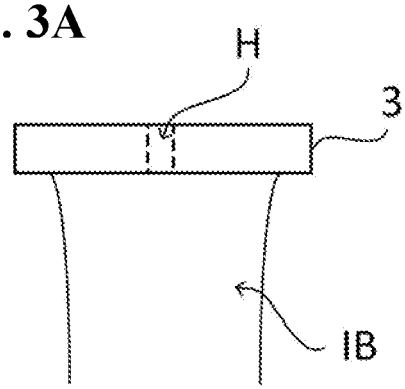
FIGS. 3A to 3C are explanatory diagrams illustrating shifting of a position of a suppression electrode, according to embodiments.
Figure 3B:
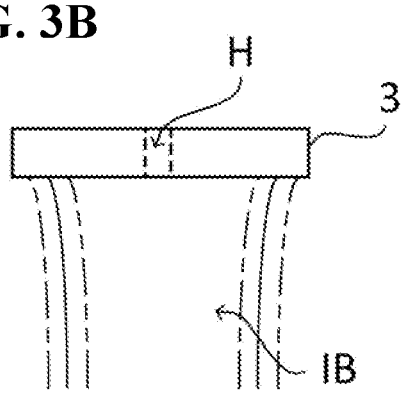
Figure 3C:
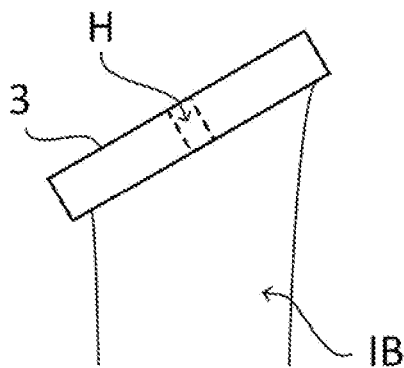

FIGS. 3A to 3C depict a state in which the suppression electrode 3 is irradiated with the ion beam during the cleaning operation. FIG. 3A shows a state in which the suppression electrode 3 is irradiated with the ion beam when the suppression electrode 3 is located at the position shown in FIG. 1B.

FIG. 3B shows a state in which the suppression electrode 3 is irradiated with the ion beam when a position of the extraction electrode E in FIG. 3A is further shifted in the V-direction in FIG. 1 by the drive mechanism 5.

FIG. 3C shows a state in which the suppression electrode 3 is irradiated with the ion beam when a position of the extraction electrode E in FIG. 3A is further rotated in a direction indicated by the arrowed line W in FIG. 1, by the drive mechanism 5.

In the states in FIGS. 3B and 3C, a region of the suppression electrode 3 irradiated with the ion beam is widened, as compared with the state in FIG. 3A. Thus, in order to more widely remove the deposition substance from the suppression electrode 3, in some embodiments the technique of increasing the distance between the plasma chamber 2 and the suppression electrode 3 may be used in combination with the technique of shifting the position or the inclination of the suppression electrode 3 in a direction perpendicular to the ion beam extraction direction.

Further, in some embodiments both the techniques as described with reference to FIGS. 3B and 3C may be combined with the technique as described with reference to FIG. 3A. Further, the position and/or the inclination of the suppression electrode 3 may be set as shown in FIG. 3B and/or 3C, prior to the cleaning. Alternatively, the cleaning of the suppression electrode 3 may be performed, while the position and/or the inclination of the suppression electrode 3 is continuously shifted.

The above embodiments have been described based on an example where the operation state is automatically switched using the control device C. Alternatively, in some embodiments, the switching of the operation state may be manually performed by an operator.

In the above embodiments, in the flowchart of FIG. 2, switching of the type of gas and shifting of the position of the extraction electrode are performed in this order. However, embodiments are not limited to this order. Alternatively, in some embodiments, the switching and the shifting may be simultaneously performed. Alternatively, in other embodiments, the order described in the flowchart may be reversed such that the position of the extraction electrode is shifted, and then the type of gas is switched.

In the above embodiments, the extraction electrode E is moved by the drive mechanism 5 to change the distance between the plasma chamber 2 and the extraction electrode E. Alternatively, in some embodiments, when changing this distance, the plasma chamber 2 may be moved.

Figure 4A:
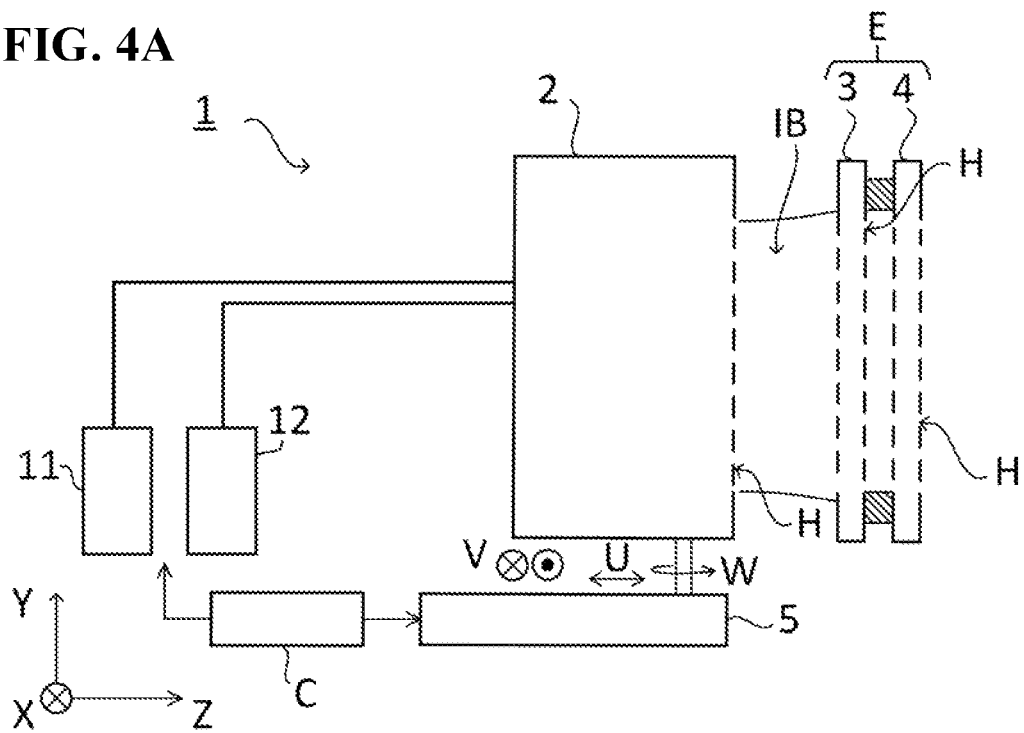
FIGS. 4A and 4B are schematic top plan views of an ion source according to an embodiment.
Figure 4B:
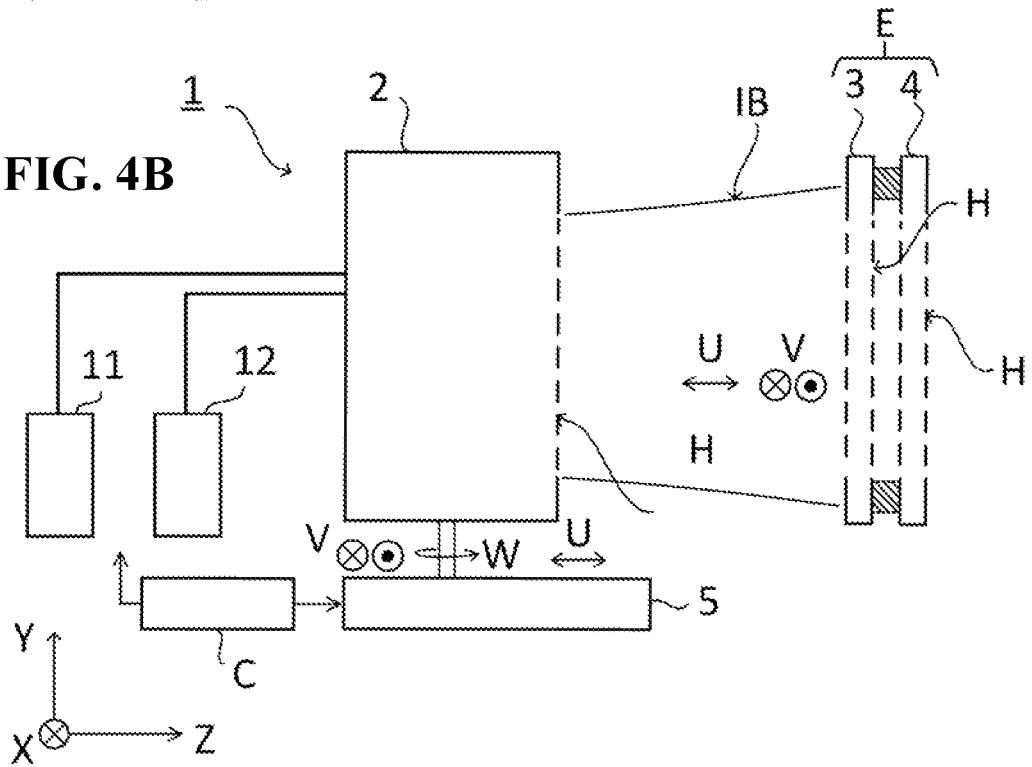

Specifically, as depicted in FIGS. 4A and 4B, in some embodiments, the plasma chamber 2 may be moved by the drive mechanism 5, while the extraction electrode E is fixed. This configuration may also provide the aforementioned advantageous effects.

It should be understood that the present invention is not limited to the above embodiments, but various changes and modifications may be made therein without departing from the spirit and scope of the present disclosure as set forth in appended claims.

What is claimed is:

1. An ion source comprising:
a plasma chamber, and a suppression electrode disposed downstream of the plasma chamber, wherein the ion source is operable to continuously irradiate the suppression electrode with an ion beam produced from a cleaning gas to clean the suppression electrode, and wherein the ion source further comprises:
a drive mechanism that adjusts a distance between the plasma chamber and the suppression electrode; and
a control device configured to, prior to cleaning the suppression electrode, control the drive mechanism to move the suppression electrode or the plasma chamber in a first direction to increase the distance.

2. The ion source as recited in claim 1, wherein the control device is configured to determine, based on a potential of the suppression electrode, or a current flowing through the suppression electrode, whether or not to continue the cleaning.

3. The ion source as recited in claim 1, wherein the control device is configured to control the drive mechanism to move the suppression electrode in a second direction orthogonal to the first direction.

4. The ion source as recited in claim 3, wherein the control device is configured to control the drive mechanism to rotate the suppression electrode about an axis that extends in a third direction orthogonal to the first direction and the second direction.

5. The ion source as recited in claim 1, wherein the control device is configured to control the drive mechanism to rotate the suppression electrode about an axis that extends in a second direction orthogonal to the first direction.

6. A cleaning method for an ion source comprising a plasma chamber, and a suppression electrode disposed downstream the plasma chamber, the cleaning method comprising:
moving the suppression electrode or the plasma chamber in a first direction to increase a distance between the plasma chamber and the suppression electrode; and
continuously irradiating the suppression electrode with an ion beam produced from a cleaning gas to clean the suppression electrode.

7. The cleaning method as recited in claim 6, wherein the moving occurs prior to a start of the irradiating.

8. The cleaning method as recited in claim 6, wherein the moving occurs during the irradiating.

9. The cleaning method as recited in claim 6, further comprising moving the suppression electrode in a second direction orthogonal to the first direction.

10. The cleaning method as recited in claim 9, further comprising rotating the suppression electrode about an axis that extends in a third direction orthogonal to the first direction and the second direction.

11. The cleaning method as recited in claim 6, further comprising rotating the suppression electrode about an axis that extends in a second direction orthogonal to the first direction.

12. An ion source comprising:
a plasma chamber;
a suppression electrode disposed downstream of the plasma chamber in an ion beam extraction direction;
a drive mechanism that is connected to the suppression electrode or to the plasma chamber; and
a control device configured to control the drive mechanism to move the suppression electrode or the plasma chamber to increase a distance between the plasma chamber and the suppression electrode,
wherein an ion beam from the plasma chamber continuously irradiates the suppression electrode to clean the suppression electrode.

13. The ion source as recited in claim 12, wherein the control device controls the drive mechanism to move the suppression electrode or the plasma chamber prior to cleaning the suppression electrode.

14. The ion source as recited in claim 12, wherein the control device increases the distance in a first direction, and the control device is further configured to control the drive mechanism to move the suppression electrode in a second direction orthogonal to the first direction.

15. The ion source as recited in claim 14, wherein the control device is configured to control the drive mechanism to rotate the suppression electrode about an axis that extends in a third direction orthogonal to the first direction and the second direction.

16. The ion source as recited in claim 12, wherein the control device increases the distance in a first direction, and the control device is further configured to control the drive mechanism to rotate the suppression electrode about an axis that extends in a second direction orthogonal to the first direction.

* * * * *